(12) United States Patent
O'Neill et al.

(10) Patent No.: US 6,366,108 B2
(45) Date of Patent: *Apr. 2, 2002

(54) SYSTEM AND METHOD FOR DETECTING DEFECTS WITHIN AN ELECTRICAL CIRCUIT BY ANALYZING QUIESCENT CURRENT

(75) Inventors: Peter M. O'Neill, Ft. Collins, CO (US); Victor Johansen, Santa Clara; Peter Maxwell, Sunnyvale, both of CA (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/203,295

(22) Filed: Dec. 1, 1998

(51) Int. Cl.[7] .................................. G01R 31/02

(52) U.S. Cl. ....................... 324/763; 324/765

(58) Field of Search .................. 324/763, 765, 324/768, 769, 771

(56) References Cited

U.S. PATENT DOCUMENTS

| | | | |
|---|---|---|---|
| 5,670,892 A | * 9/1997 | Sporck | 324/765 |
| 5,675,253 A | 10/1997 | Smith, et al. | 324/306 |
| 5,784,166 A | 7/1998 | Sogard | 356/363 |
| 5,914,615 A | * 6/1999 | Chess | 324/765 |

FOREIGN PATENT DOCUMENTS

| | | | |
|---|---|---|---|
| EP | 0694961 A1 | 7/1995 | H01L/21/66 |
| EP | 0840227 A1 | 10/1997 | G06F/11/24 |
| EP | 1008857 | 8/1999 | G01R/31/30 |

OTHER PUBLICATIONS

U.S. Patent Application Ser. No. 08/841,175 (Now US. Patent 5,914,615), entitled "A Method of Improving the Quality and Efficiency of IDDQ testing," and filed Apr. 29, 1977, by Chess.

Gattiker, et al., "Current Signatures for Production Testing", IEEE 1996, pp. 25–28.

Gattiker, et al., "Current Signatures", IEEE, 14th VLSI Test Symposium—1996, pp. 112–117.

* cited by examiner

*Primary Examiner*—Safet Metjahic
*Assistant Examiner*—James C Kerveros
(74) *Attorney, Agent, or Firm*—Alex J. Neudeck

(57) ABSTRACT

The present invention, in general, provides for a testing system and method for detecting defects within a circuit. A current signature of the quiescent current of the circuit is determined, and certain constant values are calculated based on the current signature using a linear iterative regression. A defect free state for the circuit associated with a minimum quiescent current ($I_{DDQ}$) is then determined. The $I_{DDQ}$ of the circuit for this state is measured, and a signal indicating the $I_{DDQ}$ at this state is used along with the aforementioned constant values to create upper and lower threshold values. Thereafter, signals indicating the value of $I_{DDQ}$ for a plurality of other states are compared to the upper and lower threshold values. The circuit is determined to be defective if the values of any of the signals is greater than the upper threshold value or is less than the lower threshold value.

21 Claims, 7 Drawing Sheets

SYSTEM AND METHOD FOR DETECTING DEFECTS WITHIN AN ELECTRICAL CIRCUIT BY ANALYZING QUIESCENT CURRENT

BACKGROUND OF THE INVENTION

1. Field of the Invention

The present invention generally relates to quiescent current testing and, more particularly, to a system and method for detecting defects within a complementary metal oxide silicon (CMOS) circuit by measuring and characterizing the power supply current conducted by the circuit in multiple quiescent states.

2. Related Art

An ideal complementary metal oxide silicon (CMOS) integrated circuit conducts a negligible amount of current when the circuit is in standby or a quiescent state. Therefore, when a CMOS circuit is not switching states, only a small amount of quiescent current should be conducted by the circuit. The quiescent current, commonly referred to as "$I_{DDQ}$," is composed primarily of leakage current. A defective circuit may draw a significantly larger amount of quiescent current than a non-defective circuit.

Typical $I_{DDQ}$ testing includes setting a threshold value of $I_{DDQ}$ in which the circuit being tested is failed if the $I_{DDQ}$ conducted by the circuit exceeds the threshold value. In this regard, input vectors drive the circuit's nodes to predetermined states, and the $I_{DDQ}$ is measured while the circuit's nodes are held in the predetermined states. $I_{DDQ}$ testing may be done at a single state or it may include stepping through many different input test vectors to test various states. The test vectors can be generated by automatic test pattern generation (ATPG) software tools or by integrated circuit designers.

One of the difficulties of $I_{DDQ}$ testing is setting the threshold value. A circuit that draws more current than the threshold value of $I_{DDQ}$ for any input test vector is declared defective. A circuit that draws less current than the threshold value of $I_{DDQ}$ is considered non-defective. If the threshold value is set too high, then circuits that contain defects may be considered non-defective. If the threshold value is too low, then circuits that are free of defects may fail the $I_{DDQ}$ test. This increases the cost of the circuits considered non-defective. Therefore, the determination of the threshold value for $I_{DDQ}$ testing usually involves a tradeoff between the quality and the cost of the circuits which pass $I_{DDQ}$ testing.

As the scale of CMOS circuits is increasingly reduced to increase speed and density and to decrease cost, the background current drawn by the CMOS circuits is increased. As known in the art, $I_{DDQ}$ consists of two components (1) defect current, which is the current drawn by a circuit due to defects within the circuit and (2) background current, which is $I_{DDQ}$ minus the defect current. The scale of CMOS circuitry has reached levels where the magnitude of the background current is comparable to or even exceeds the defect current. Therefore, it has become more difficult to determine whether a variation in $I_{DDQ}$ is due to a variation in background current or is due to a defect, thereby frustrating the process of identifying which circuits are defective.

Process variations of the fabrication of electrical circuits further complicate the determination of the $I_{DDQ}$ threshold value. Process variations are differences that exist between individual circuits of the same circuit design. Process variations can affect the quiescent current drawn by the circuits. For example, two integrated circuits of the same design can draw different $I_{DDQ}$ values for the same set of input test vectors due to process variations between the two circuits.

Gattiker and Maly (A. E. Gattiker and W. Maly, "Current Signatures", Proc. VLSI Test Symposium, pp. 112–117, 1996) have proposed a method which eliminates some of the threshold selection problems. Traditionally, testing of a circuit ends as soon as the circuit fails the $I_{DDQ}$ test. Gattiker and Maly propose that $I_{DDQ}$ values be measured for a complete set of input test vectors. A complete set of input test vectors include enough test vectors to completely exercise the functionality of the circuitry within the circuit being tested. From the measured values of $I_{DDQ}$, a current signature is generated. The current signature includes an ordering of the $I_{DDQ}$ measurements from the smallest value to the largest value. Gattiker and Maly claim that the magnitude of the measurements is not as important as the shape of a plot of the current signature. If there are no large jumps in the plot of the current signature, then the circuit is designated as non-defective. If the plot of the current signature includes any significant jumps or discontinuities, then the circuit is designated as defective.

The $I_{DDQ}$ signature concepts proposed by Gattiker and Maly represent important findings in $I_{DDQ}$ testing analysis. However, these concepts cannot be directly implemented into present-day integrated circuit manufacturing environments. Testing methods using the Gattiker and Maly $I_{DDQ}$ signature concepts require a complete set of input vector test settings to be applied to the integrated circuit under test and the resultant measured values of $I_{DDQ}$ for each input vector setting to be analyzed. Determination of the values of $I_{DDQ}$ for a complete set of input vector settings takes too long to implement in circuit manufacturing environment at a reasonable cost.

It is desirable to provide a system and method for $I_{DDQ}$ testing which overcomes the limitations of present $I_{DDQ}$ testing methods using a single threshold test. Furthermore, it is desirable that the method of $I_{DDQ}$ testing be easily implemented into existing circuit manufacturing environments by not requiring excessive storage and analysis of measured values of $I_{DDQ}$.

SUMMARY OF THE INVENTION

The present invention overcomes the inadequacies and deficiencies of the prior art as discussed herein. The present invention provides a system and method for detecting defects in electrical circuits by analyzing quiescent current.

In general, the present invention utilizes a circuit, a power supply unit, a current meter, and a analyzer. The power supply unit is connected to the circuit and transmits supply current to the circuit. The current meter measures the supply current and transmits a first signal and a second signal respectively indicating a first value and a second value of the supply current. The analyzer receives the first parameter and determines a threshold value based on the first parameter value. The analyzer then receives the second signal and compares the second signal to the threshold value. The analyzer determines whether a defect is detected based on the comparison of the second signal to the threshold value.

In accordance with another feature of the present invention, the analyzer also determines a second threshold value based on the first signal. The analyzer can then determine whether a defect is detected by comparing the second signal to the second threshold value.

In accordance with another feature of the present invention, the analyzer calculates the threshold values based on predetermined constants. To determine the predetermined constants, the values of signals indicating the supply current values for a plurality of states and a plurality of circuits are measured. Then, selected values of the signals are then plotted to create a current signature of the circuits. A regression is then used to remove outliers from the plot and to fit a curve or line to the plotted points. The predetermined constants are then determined from the fitted curve or line, and the predetermined constants are used by the analyzer to determine the threshold values for each of the circuits tested.

The present invention can also be viewed as providing a method for detecting defects within circuits. Briefly described, the method can be broadly conceptualized by the following steps: providing a circuit; measuring a value of a supply current associated with the circuit when the circuit is in a first state; determining a threshold value based on the value of the supply current measured in the measuring step; receiving a signal indicating another value of the supply current when the circuit is in a second state; comparing the signal to the threshold value; and detecting a defect in the circuit based on the comparing step.

The present invention has many advantages, a few of which are delineated hereafter, as mere examples.

An advantage of the present invention is that defects in circuits can be detected by comparing the quiescent current associated with circuit to threshold values. These comparisons can be achieved without determining the value of the quiescent current, thereby making the comparisons relatively fast.

Another advantage of the present invention is that the cost associated with quiescent current testing can be significantly reduced.

Another advantage of the present invention is that quiescent current testing can be achieved by comparing the quiescent current of a circuit to thresholds that are uniquely calculated for each circuit. Therefore, the effects of fluctuations in background current are reduced.

Other features and advantages of the present invention will become apparent to one skilled in the art upon examination of the following detailed description, when read in conjunction with the accompanying drawings. It is intended that all such features and advantages be included herein within the scope of the present invention, as is defined by the claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION OF THE INVENTION

In general, the present invention provides a testing system and method for detecting defects within an electrical circuit. In this regard, upper and lower threshold values for the quiescent current ($I_{DDQ}$) of the circuit are determined, and a signal indicating the $I_{DDQ}$ value for the circuit at a plurality of states is compared to the upper and lower threshold values. A defect is detected when the signal corresponds to a value greater than the upper threshold value or less than the lower threshold value.

Figure 1:
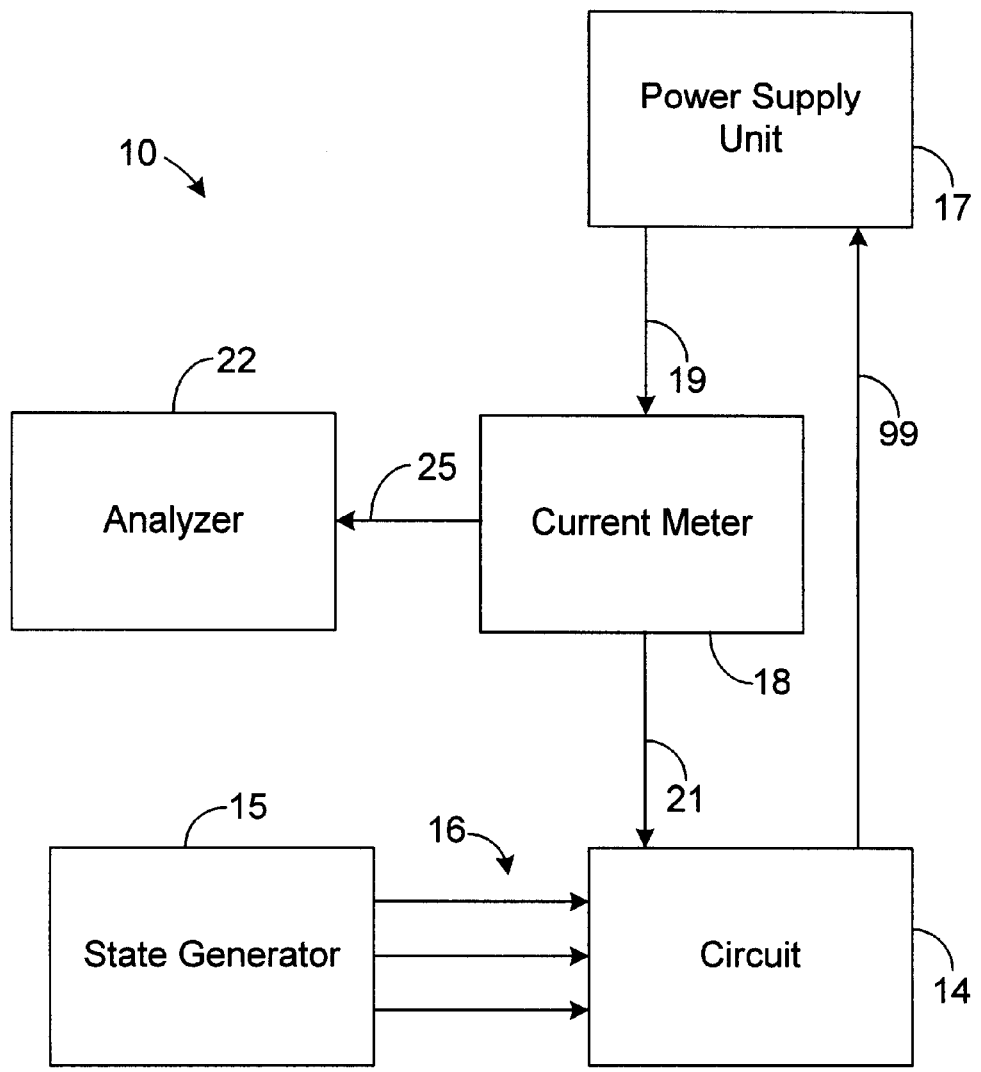
FIG. 1 depicts a block diagram illustrating a testing system in accordance with the present invention.

FIG. 1 depicts a testing system 10 in accordance with the preferred embodiment of the present invention. The system 10 includes a circuit 14, such as a complementary metal oxide silicon (CMOS) integrated circuit, that is to be tested for defects. The state of the circuit 14 is controlled by a state generator 15, which transmits input signals via connections 16 to the circuit 14. As known in the art, the values of the input signals can be adjusted to transition the circuit 14 into different states. The number of connections 16 may vary depending on the number of states that are to be tested.

A power supply unit 17 is designed to transmit supply current to a current meter 18 via connection 19. The current meter 18 is designed to pass the supply current to circuit 14 via connection 21 and to provide a test signal to an analyzer 22 via connection 25. The current meter 18 may be included in the power supply unit 17 or may be in a stand alone configuration. The test signal transmitted to the analyzer 22 by the current meter 18 indicates the value of $I_{DDQ}$ (which is the supply current being provided to the circuit 14 via connection 25 when the circuit 14 is in a quiescent state). For example, in the preferred embodiment, the current meter 18 is designed to produce a voltage signal on connection 25 proportional to the supply current being transmitted to the circuit 14 via connections 19 and 21. However, the test signal may be other types of signals as long as it indicates the value of $I_{DDQ}$. For example, it is possible for the test signal to be a current signal with a current value matching or corresponding with the current value of $I_{DDQ}$. It is also possible for the test signal to be a digital signal having a digital value corresponding with the current value of $I_{DDQ}$.

The analyzer 22 is designed to receive the test signal and to detect defects in the circuit 14 based on the test signal. The analyzer 22 can be implemented in software, hardware, or a combination thereof. In the preferred embodiment, as illustrated by way of example in FIG. 2, the analyzer 22 is implemented in software and stored in memory 30 of a computer system 31.

Note that the analyzer 22 can be stored and transported on any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory. As an example, the analyzer 22 may be magnetically stored and transported on a conventional portable computer diskette.

Figure 2:
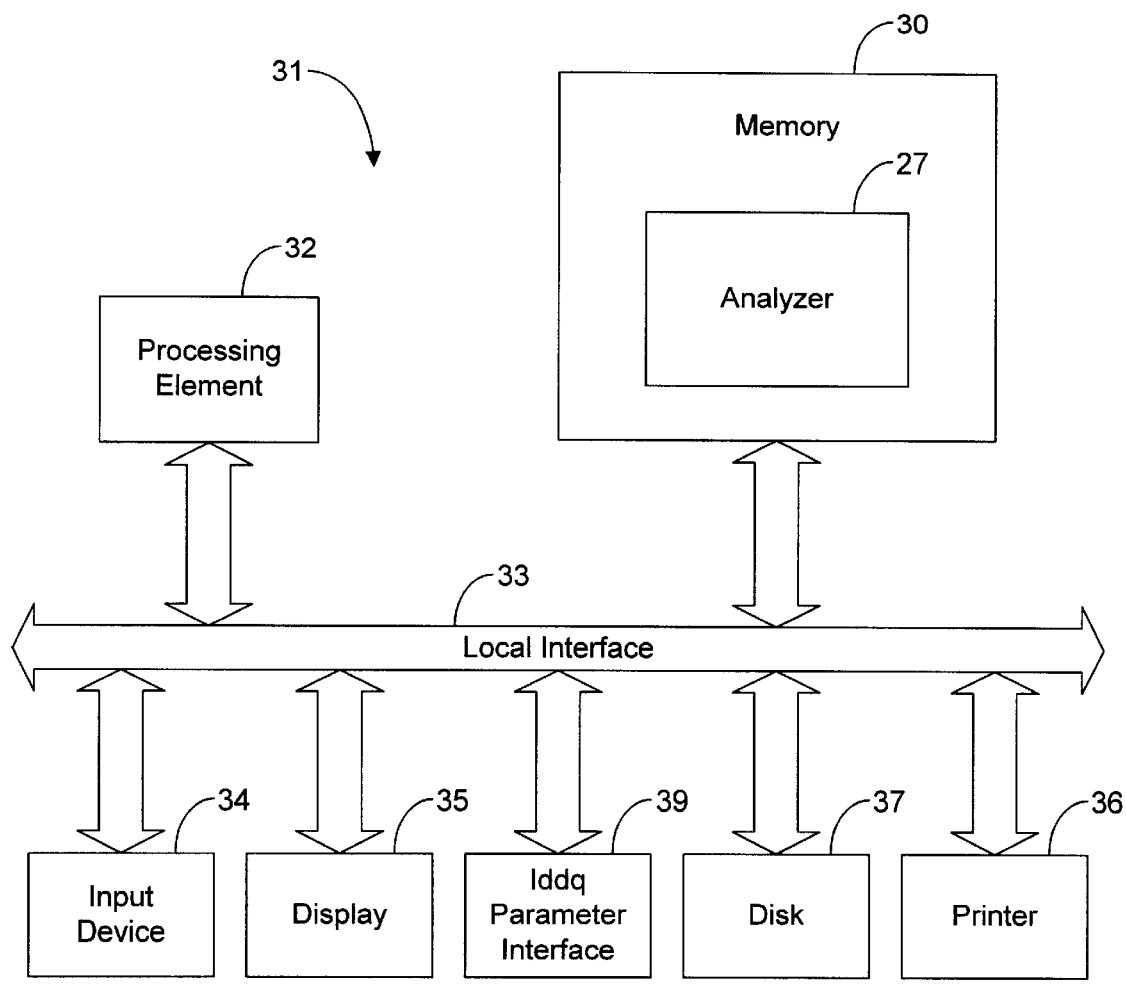
FIG. 2 depicts a block diagram illustrating a computer system employing the analyzer of FIG. 1.

The preferred embodiment of the computer system 31 of FIG. 2 comprises one or more conventional processing elements 32, such as a digital signal processor (DSP), that communicate to and drive the other elements within the computer system 31 via a local interface 33, which can include one or more buses. Furthermore, an input device 34, for example, a keyboard or a mouse, can be used to input data from a user of the computer system 31, and screen display 35 or a printer 36 can be used to output data to the user. A disk storage mechanism 37 can be connected to the local interface 33 to transfer data to and from a nonvolatile disk (e.g., magnetic, optical, etc.). Furthermore, an test signal interface 39 receives the test signal from connection 25 (FIG. 1) and interfaces the test signal with the local interface 33. It should be noted that input device 34, display 35, printer 36, and disk 37 are optional and are not a part of the preferred embodiment, although other embodiments may include these features.

The analyzer 22, which will be discussed in further detail hereinafter, is configured to calculate or otherwise determine upper and lower threshold values for the test signal. The analyzer 22 is then designed to compare the test signal to the upper and lower threshold values and to determine that the circuit 22 is defective when the test signal is greater than the upper threshold value or is less than the lower threshold value.

The analyzer 22 preferably utilizes a predetermined formula to calculate the upper and lower threshold values. In the preferred embodiment, this predetermined formula is modeled from the equation of a line. In this regard, the formula used by the analyzer 22 is:

$$I_{DDQ,max} = m \times I_{DDQ,min} + b \quad \text{Equation (1)}$$

where $I_{DDQ,max}$ is the maximum measured test signal value for the circuit 14 in a defect free state, $I_{DDQ,min}$ is the minimum measured test signal value for the circuit 14 in a defect free state, m is a predetermined constant, and b is a predetermined constant. These values are predetermined in that they are determined before the first circuit 14 is tested. Determination of these values will be discussed in further detail hereinafter in the Operation section.

The upper threshold value is preferably defined as the value of $I_{DDQ,max}$ plus an outlier margin value, and the lower threshold value is preferably defined as $I_{DDQ,min}$ minus the outlier margin value. The addition and subtraction of the outlier margin value in calculating the threshold values allows small variations in $I_{DDQ}$ to exist without incorrectly declaring the circuit 14 as defective when the small variations do not result from a defect. In other words, the addition and subtraction of the outlier margin value allows for small variations to occur which are attributable to measurement inaccuracies and/or process variations instead of circuit defects. The outlier margin value in the preferred embodiment is three times the standard deviation of the residuals of the regression, although the outlier margin value can be set to other values. Calculation of the outlier margin value and performance of the regression will be discussed in further detail hereinafter.

Once $I_{DDQ,max}$, $I_{DDQ,min}$, and the outlier margin value have been determined, the analyzer 22 is configured to calculate the upper and lower threshold values. The analyzer 22 is designed to then compare the upper and lower threshold values to the test signal transmitted on connection 25 to detect defects within the circuit 14.

OPERATION

The preferred use and operation of the testing system 10 and associated methodology are described hereafter.

Before the circuit 14 is tested, the behavior of the circuit 14 is modeled to determine the outlier margin value and the values of m and b of Equation (1). In this regard, the test signal value of a plurality of circuits 14 (each circuit 14 having the same design) is measured at a plurality of states for each circuit 14, as shown by blocks 52 and 55 of FIG. 3A. FIG. 4 depicts the current signature for one of the circuits 14. Generally, the current signature is the shape of the curve representing the current versus state of a circuit 14 or is any set of parameters that represent the shape of the curve. Measuring and plotting in FIG. 4 test signals from a plurality of circuits 14 characterizes the behavior of $I_{DDQ}$ over a range of manufacturing (i.e., process) variation. The number of states measured for each circuit 14 can vary.

Figure 3A:
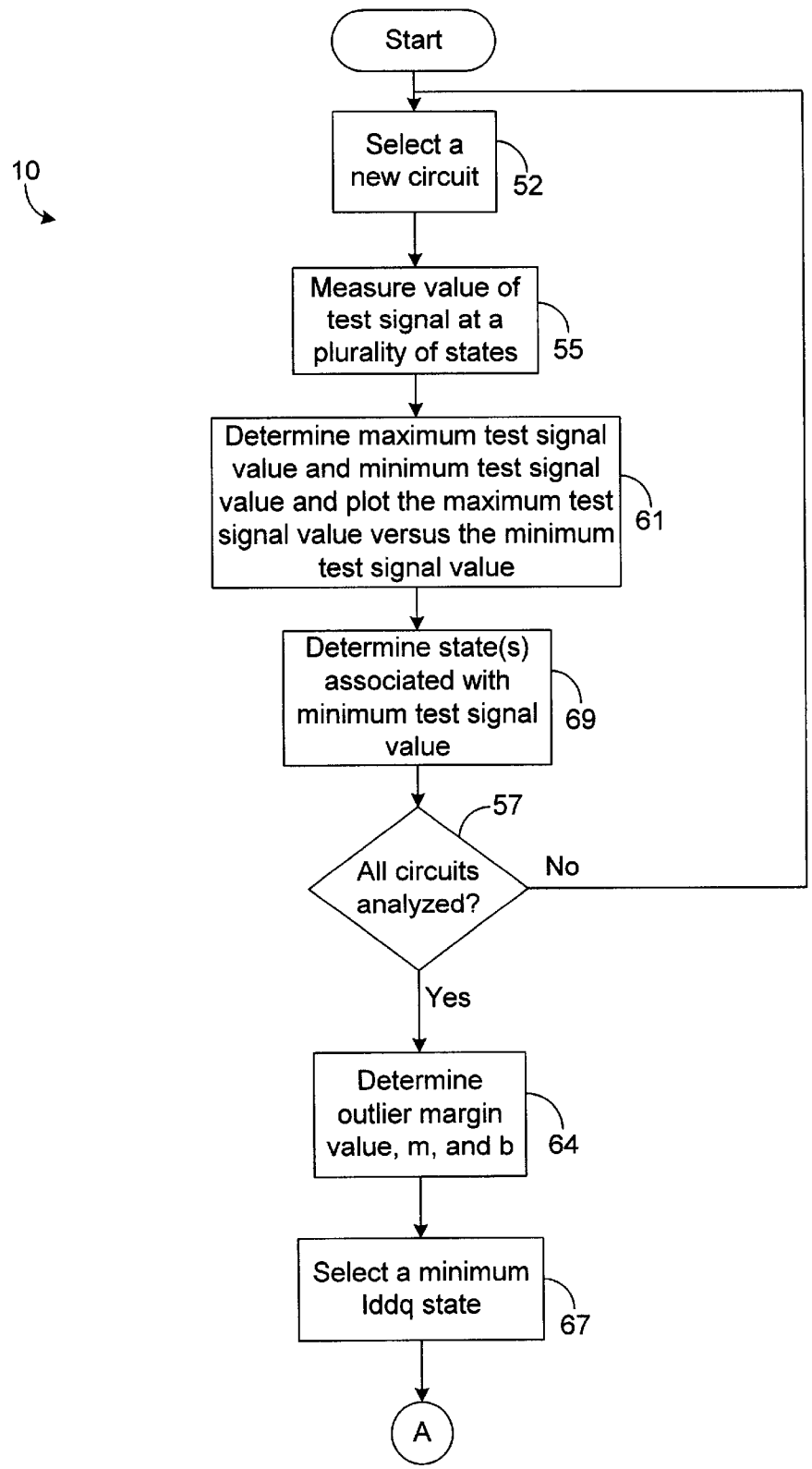
FIGS. 3A and 3B depict a flow chart illustrating the architecture, functionality, and operation of the testing system of FIG. 1.
Figure 4:
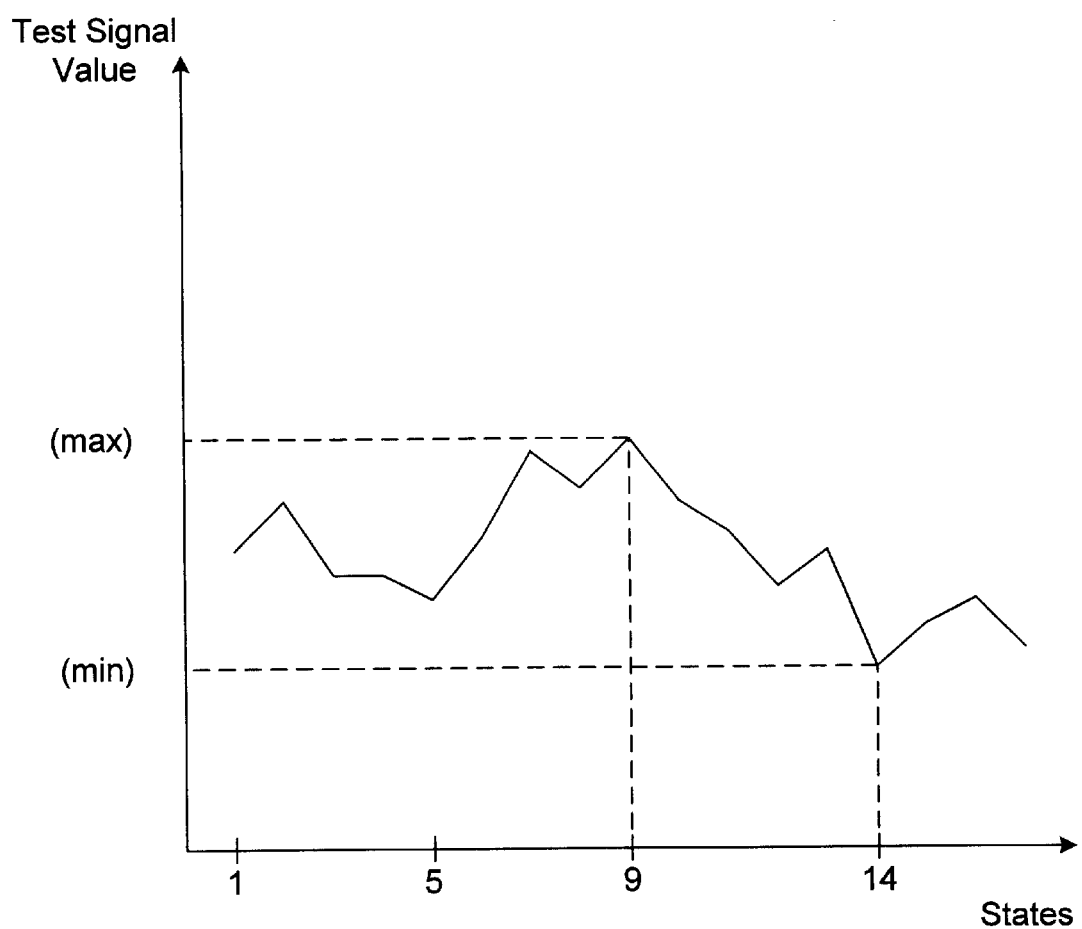
FIG. 4 depicts a graph of the test signal value versus state for a circuit being tested by the testing system of FIG. 1.
Figure 5:
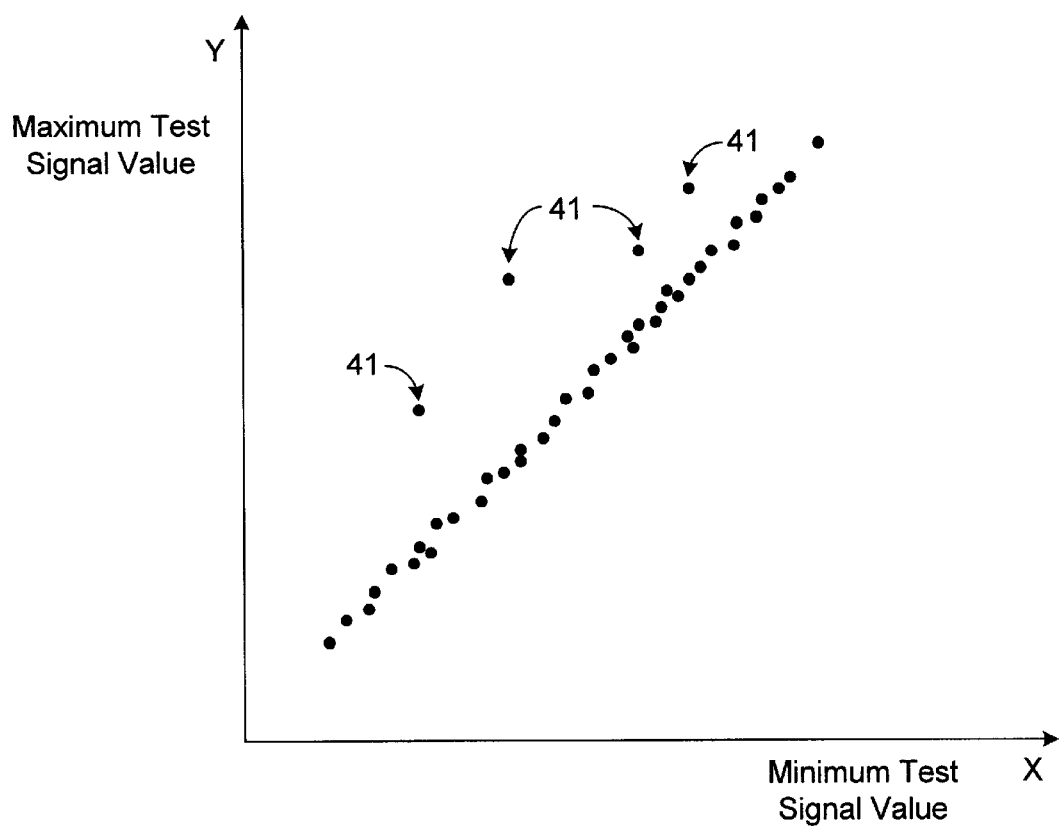
FIG. 5 depicts a graph of the maximum test signal value versus the minimum test signal value for each circuit being measured to derive the outlier margin value and the values of m and b.

The maximum test signal value measured for each circuit 14 at any one of the measured states is preferably plotted versus the minimum test signal value measured for each circuit 14 at any one of the measured states, as shown by FIG. 5 and blocks 57 and 61 of FIG. 3A. In other words, each dot of FIG. 5 represents the maximum test signal value measured at any state for a single circuit 14 versus the minimum test signal value measured at any state for the single circuit 14. For example, using the data shown in FIG. 4, the value of the test signal at state 9 versus the value of the test signal at state 14 would comprise one dot in FIG. 5.

The graph of FIG. 5 is preferably used to determine the outlier margin value in block 64. The outlier margin value is preferably three times the standard deviation of the regression residuals of the points plotted in FIG. 5. The standard deviation can be calculated through techniques well known in the art. In the preferred embodiment, the standard deviation is calculated by performing an iterative linear regression (removing outliers at each iteration), although non-linear regression may also be used. As known in the art, an outlier is defined as points outside of the distribution of a population. The iterations of the regression terminate or stop when all remaining residuals are determined to be from a single population. Such regression techniques are well known in the art.

Figure 6:
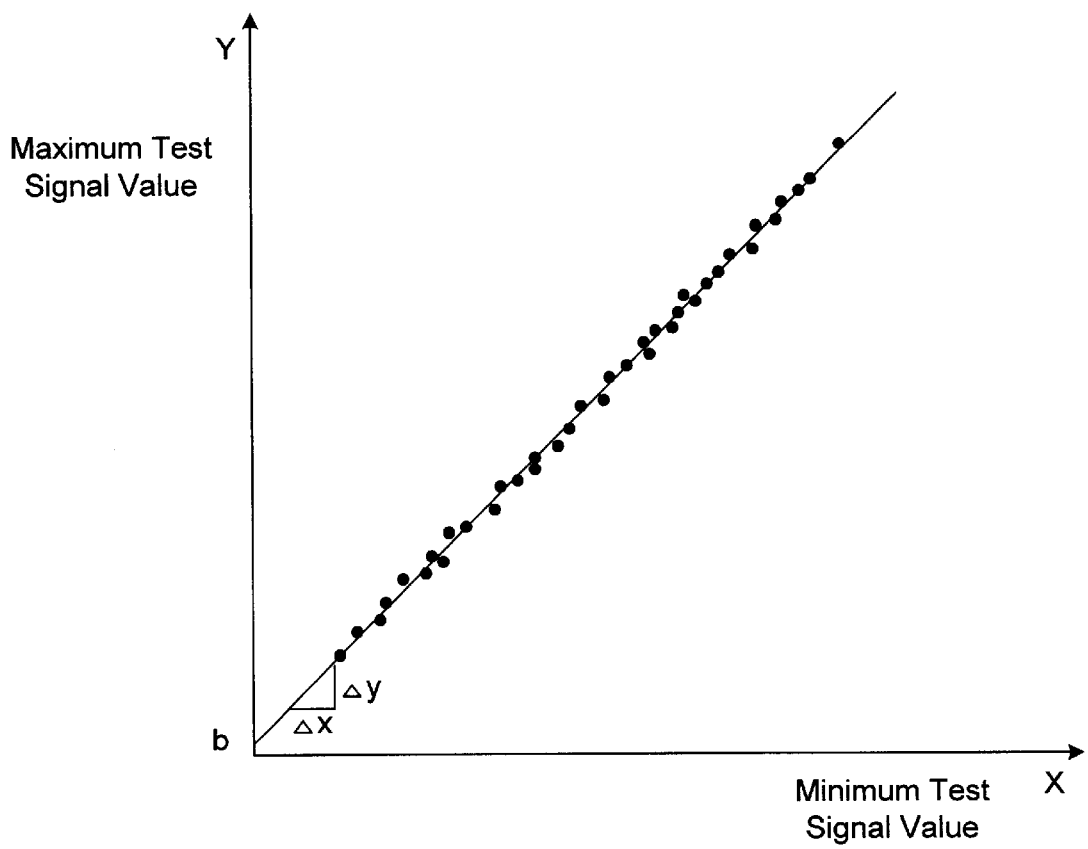
FIG. 6 depicts the graph of FIG. 5 after linear regression.

For illustrative purposes, assume that points 41 of FIG. 5 are determined to be outliers because of their respective position from the other points in the graph. It is likely that points 41 are located significantly far from the line established by the majority of the points on the graph due to defects and/or errors in measurement of the $I_{DDQ}$ values drawn by the circuits 14 associated with the points 41. Points 41 are identified as outliers and are, therefore, removed during the regression such that the graph of FIG. 6 is produced. Once all of the outliers have been removed and the linear regression is complete, the values of m and b that best represent the circuit's defect free behavior can be determined. In this regard, m is the slope (i.e., $\Delta Y/\Delta X$) of the fitted line, and b is the y-intercept of the fitted line. It should be noted that other techniques may be utilized for removing outliers and for fitting a curve or line to the sample points of FIG. 6.

After calculating the outlier margin value and the values of m and b, these values are stored in memory 30 of the computer system 31 (FIG. 2). Then, the inputs to the circuit 14 shown in FIG. 1 are set by the state generator 16 to put the circuit 14 into a minimum $I_{DDQ}$ state. The minimum $I_{DDQ}$ state is selected at block 67 of FIG. 3A and is the state where the plurality of circuits 14 measured to derive FIG. 6 draw the smallest $I_{DDQ}$ value, as determined at block 69. The smallest $I_{DDQ}$ value may change from circuit 14 to circuit 14, but the state at which the smallest $I_{DDQ}$ values occur should be constant. This state is the minimum $I_{DDQ}$ state. For example, in FIG. 4, the minimum $I_{DDQ}$ state is state 14 since state 14 corresponds with the lowest measured value of $I_{DDQ}$.

It should be noted that due to process variations and/or other factors, it is possible that the same state for each circuit 14 does not produce a minimum $I_{DDQ}$ for the circuit 14. It is sufficient for the purposes of the present invention that only a significant number of circuits 14 produce a minimum $I_{DDQ}$ at the state selected as the minimum $I_{DDQ}$ state. Furthermore, it is possible that multiple states may produce the minimum $I_{DDQ}$ value. In this situation, any one of the states producing the minimum $I_{DDQ}$ value or a value close to the minimum $I_{DDQ}$ value may be selected as the $I_{DDQ}$ minimum state.

When a particular circuit 14 is to be tested, the state generator 15 produces values on connections 16 that place the circuit in the minimum $I_{DDQ}$ state. The analyzer 22 then reads the test signal on connection 25 and determines the value of the test signal at the minimum $I_{DDQ}$ state, as shown by blocks 72 and 75 of FIG. 3B. This value of the test signal is $I_{DDQ,min}$ of Equation (1). Then, the analyzer 22 calculates the upper and lower threshold values for the circuit 14 at block 77. In this regard, the analyzer 22 subtracts the outlier margin value from $I_{DDQ,min}$ to determine the lower threshold. The analyzer 22 then determines $I_{DDQ,min}$ via Equation (1) where $I_{DDQ,min}$, b and m are now known values. The analyzer 22 adds the outlier margin value to $I_{DDQ,max}$ to determine the upper threshold.

Figure 3B:
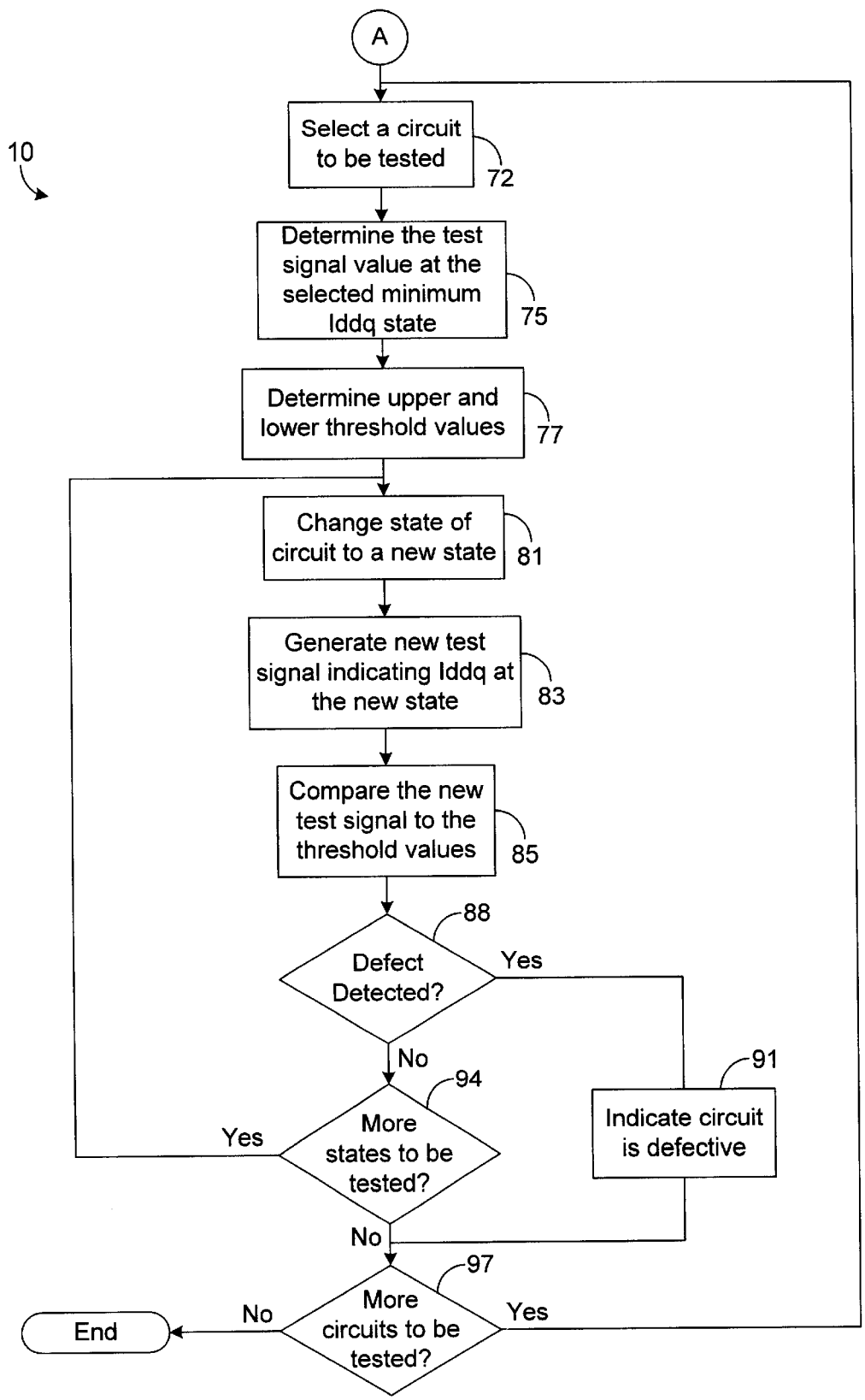

The state of the circuit 14 is then changed in block 81 of FIG. 3B via the inputs from signal generator 15 to any desirable testing state. The analyzer 22 compares the test signal currently generated by the current meter 18 to the upper and lower threshold values, as shown by blocks 83 and 85. The analyzer 22 detects a defect at block 88 if the test signal is greater than the upper threshold value or if the test signal is less than the lower threshold value. No defect is detected if the test signal is less than the upper threshold value and greater than the lower threshold value. If a defect is detected, then the analyzer 22 preferably indicates via display 35 or printer 36 (FIG. 2) that a defect has been discovered, as shown by block 91 of FIG. 3B. Furthermore, pursuant to conventional manufacturing techniques, the defective circuit is preferably marked as defective or separated from the other circuits that have not been determined to be defective.

It should be noted that many hardware comparators exist in the art for determining whether one signal is greater than another signal. If desired, the analyzer 22 may include or employ such a comparator to determine whether the test signal exceeds the threshold values. In this regard, the analyzer 22 preferably transmits an analog signal to the comparator. The analog signal preferably has a voltage or current value proportional to the value of one of the threshold values. The comparator, through techniques known in the art, can then determine whether the signal corresponding with the threshold value is greater than the test signal without knowing or discovering the actual values of either the test signal or the threshold value. It should be noted, however, that it is also possible to perform the comparisons in software or a combination of hardware and software.

After determining whether a defect is detected at the current state, the state of the circuit 14 is changed by the state generator 15, and the test signal at this new state is again tested for defects. As shown by block 94 of FIG. 3B, this process is continued until a desired number of states have been tested or until a defect is detected. If no defects have been detected at any of the states, then the analyzer 22 determines that the circuit is non-defective. However, if a defect is detected at any of the states (or, in the alternative, if a defect is detected at a predetermined number of states), then the analyzer 22 determines that the circuit 14 is defective.

Note that the value of the test signal does not actually have to be determined in comparing the test signal to the upper and lower threshold values. Only a determination as to whether the test signal is greater than or less than the threshold values needs to be made. Making such a determination is much faster than determining the value of the test signal. Therefore, a large number of states can be tested by the analyzer 22 in a relatively short time, thereby making $I_{DDQ}$ testing for a large number of states feasible.

After the circuit 14 has been tested by the analyzer 22, the circuit 14 is then replaced by a new circuit 14, as shown by blocks 97 and 72 of FIG. 3B. The new circuit 14 is then tested according to the techniques described hereinabove. As long as the new circuit 14 has the same design as the original circuit 14, the same values of the outlier margin value and of m and b can be used in testing the new circuit 14. However, new values of $I_{DDQ,min}$ and $I_{DDQ,max}$ should be calculated based on the value of the test signal for the new circuit 14 at the minimum $I_{DDQ}$ state. Therefore, new threshold values for the new circuit 14 should also be calculated based on the new values of $I_{DDQ,min}$ and $I_{DDQ,max}$, as shown by blocks 72, 75, and 77 of FIG. 3B.

It should be noted that the present invention assumes that each of the circuits 14 described hereinabove have the same design. In this regard, the values calculated for the outlier margin value and the values of m and b are unique to a specific circuit design. In deriving these values, only circuits 14 of the same design should be used.

It should also be noted that since a defect tends to increase $I_{DDQ}$, it may be possible to adequately test circuit 14 by comparing the test signal value to the upper threshold value only. However, when computing the upper threshold value, the present invention assumes that no defects exist at the minimum $I_{DDQ}$ state and if there is a defect at this state, it is possible that the defect will not be detected when only the upper threshold value is compared to the test signal. However, the defect at the minimum $I_{DDQ}$ state can be detected if the test signal is compared to the lower threshold value, as described hereinabove. Therefore, although it is possible to only compare the test signal value to either of the threshold values, it is preferable to compare the test signal value to both the upper and lower threshold values so that the probability of detecting a defect is maximized.

In addition, it is well known that most circuits 14 have an absolute maximum value for $I_{DDQ}$ that is established by the circuit's design and specifications of the process in which it is manufactured. Therefore, the calculated maximum threshold value should not correspond with an $I_{DDQ}$ value that exceeds the absolute maximum value for the circuit 14. If the calculated maximum threshold value corresponds to an $I_{DDQ}$ value that exceeds the absolute maximum value for the circuit 14, then a threshold value corresponding to the absolute maximum value for the circuit 14 should be used as the calculated maximum threshold value. Furthermore, current meters 18 can only provide accurate measurements at an absolute minimum $I_{DDQ}$ value or greater due to noise and other measurement inaccuracies. Therefore, the calculated minimum threshold value should not correspond to an $I_{DDQ}$ value that is less than this absolute minimum value. If the calculated minimum threshold value corresponds to an $I_{DDQ}$ value that is less than the absolute maximum value for the circuit 14, then a threshold value corresponding to the absolute minimum value for the circuit 14 should be used as the calculated minimum threshold value.

Finally, it should be noted that either the current being provided to the circuit 14 by the power supply unit 17 or the current being returned to the power supply unit 17 from the circuit 14 while the circuit 14 is in a quiescent state may be utilized to determine the test signal. As known in the art, a circuit must be complete before current can flow. Therefore, if the power supply unit 17 is providing current to circuit 14 via connections 19 and 21, there must be another connection 99 allowing current to flow into the power supply unit 17. Connection 99 is often referred to as the "ground" connection. Both the current flowing out of the power supply unit 17 via connection 19 and the current flowing into the power supply unit 17 via connection 99 indicates the value of the supply current being provided to the circuit 14, and the current flowing on either of the connections 19 and 99 may be used to define the test signal. Therefore, although FIG. 1 shows the current meter 18 connected between connections 19 and 21, it could be inserted into connection 99 instead.

In concluding the detailed description, it should be noted that it will be obvious to those skilled in the art that many variations and modifications may be made to the preferred embodiment without substantially departing from the principles of the present invention. All such variations and modifications are intended to be included herein within the scope of the present invention, as set forth in the following claims.

What is claimed is:

1. A system for detecting defects within circuits, the system comprising:

a power supply unit, said power supply unit configured to transmit supply current to a circuit coupled to said power supply unit;

a current meter configured to receive and measure said supply current, said current meter further configured to transmit signals indicative of values measured from said supply current; and an analyzer interfaced with said current meter and configured to test a plurality of circuits, said analyzer storing a test value that is based on measured supply currents transmitted to another plurality of circuits, said analyzer further configured to automatically calculate a different threshold value for each of said circuits tested by said analyzer, said analyzer configured to calculate said different threshold value for said each respective circuit utilizing said test value and a value measured by said current meter as said power supply unit is transmitting supply current to said each respective circuit, said analyzer further configured to perform a comparison of said threshold value determined for said each respective circuit to one of said signals transmitted by said current meter, said one signal indicative of a value measured by said current meter as said power supply unit is transmitting supply current to said each respective circuit, said analyzer further configured to determine whether said each respective circuit is defective based on said comparison performed for said each respective circuit.

2. A method for detecting defects within circuits, the method comprising the steps of:

providing a plurality of circuits;

modeling current signatures for said plurality of circuits;

analyzing said current signatures;

determining a test value based on said analyzing step;

measuring a value of a supply current transmitted to a circuit under test when said circuit under test is in a first quiescent state;

determining a threshold value based on said test value and said value of said supply current measured in said measuring step;

receiving a signal indicating another value of said supply current when said circuit under test is in a second quiescent state;

comparing said signal to said threshold value; and detecting a defect in said circuit under test based on said comparing step.

3. The method of claim 2, further comprising the steps of:

determining a second threshold value based on said value of said supply current measured in said measuring step; and comparing said signal to said second threshold value.

4. The method of claim 2, further comprising the step of refraining from determining a value of said signal.

5. The method of claim 2, further comprising the step of:

selecting said first quiescent state based on said current signatures, wherein said measuring step is based on said selecting step.

6. The method of claim 2, further comprising the steps of:

providing a second circuit;

measuring a value of a supply current transmitted to said second circuit when said second circuit is in said first quiescent state;

determining a new threshold value based on said test value and said value of said supply current transmitted to said second circuit;

receiving a signal indicating another value of said supply current transmitted to said second circuit when said second circuit is in another quiescent state;

comparing said new threshold value to said signal that is indicating said other value of said supply current transmitted to said second circuit; and detecting whether a defect exists in said second circuit based on said comparing said new threshold value step.

7. The method of claim 2, wherein said analyzing step includes the steps of:

selecting a first value and a second value from each of said current signatures;

plotting, for each of said current signatures, said first value versus said second value to define a graph; and performing a regression of said graph, wherein said determining a test value step is based on said regression.

8. The method of claim 7, wherein said first value is a maximum value of said each current signature, and wherein said second value is a minimum value of said each current signature.

9. The method of claim 7, further comprising the steps of:

selecting said first quiescent state based on said current signatures; and placing said circuit in said first quiescent state based on said selecting step, wherein said measuring step is performed in response to said placing step.

10. The method of claim 7, further comprising the step of:

removing outliers from said graph.

11. The method of claim 2, wherein said determining a threshold value step is based on the following equation:

$$I_{DDQ,max} = m(I_{DDQ,min}) + b,$$

where $I_{DDQ,max}$ is a value indicative of the approximate maximum measured supply current provided to said plurality of circuits while said plurality of circuits are in defect free states, where $I_{DDQ,min}$ is a value indicative of the approximate minimum measured supply current provided to said plurality of circuits while said plurality of circuits are in defect free states, and where m and b a constant values.

12. The system of claim 11 wherein m represents the slope of a line fitted to said current signatures.

13. A method for detecting defects within circuits, the method comprising the steps of:

providing a plurality of circuits;

producing signals indicating values of supply currents transmitted to different ones of said circuits when said different ones of said circuits are in quiescent states;

analyzing values of said signals;

determining a constant value based on said analyzing step;

selecting a circuit;

placing said circuit into a first state;

producing a first signal indicating a first value of a supply current of said circuit when said circuit is in said first state;

determining a threshold value based on said constant value and said first signal;

placing said first circuit into another state;

producing a second signal indicating a second value of said supply current when said circuit is in said other state; and determining whether a value of said second signal exceeds said first threshold value.

14. The method of claim 13, further comprising the steps of:

determining a second threshold value for said circuit based on said first signal; and determining whether said value of said second signal exceeds said second threshold value.

15. The method of claim 13, further comprising the steps of:

selecting a first respective value and a second respective value of said values analyzed in said analyzing step for each of said plurality of circuits;

plotting, for each of said circuits, said first respective value versus said second respective value; and performing a regression of said values plotted in said plotting step, wherein said determining a constant value step is based on said plotting step and said performing a regression step.

16. The method of claim 13, wherein said placing said circuit into a first state step is performed subsequent to said determining a constant value step.

17. A method for detecting defects within circuits, the method comprising the steps of:

providing a plurality of circuits;

modeling a current signature for each of said plurality of circuits;

analyzing each current signature modeled in said modeling step;

determining a plurality of values based on said analyzing step;

selecting a state based on current signatures modeled in said modeling step;

a value of a supply current transmitted to a circuit under test when said circuit under test is in said selected state;

determining a threshold value based on said plurality of values and said value of said supply current measured in said measuring a value of a supply current step;

measuring another value of said supply current when said circuit under test is in another state;

comparing said other value to said threshold value; and detecting whether said circuit under test is defective based on said comparing step.

18. The method of claim 17, further comprising the steps of:

selecting a first value and a second value from each current signature modeled in said modeling step; and plotting, for each current signature modeled in said modeling step, said first value and said second value to define a graph.

wherein said plurality of values determined based on said analyzing step includes a slope of said graph and an outlier margin value associated with said graph.

19. A system for detecting defects within circuits, comprising:

a power supply unit configured to transmit supply current to a circuit coupled to said power supply unit;

a current meter configured to receive and measure said supply current, said current meter further configured to transmit signals indicative of values measured from said supply current; and an analyzer interfaced with said current meter and configured to test said circuit, said analyzer storing a test value that is based on measured supply currents transmitted to a plurality of circuits, said analyzer configured to calculate automatically a threshold value for said circuit based on said stored test value and one of said signals, said one signal indicative of said supply current while said circuit is in a first quiescent state, said analyzer further configured to perform a comparison between said threshold value and a value of another of said signals, said other signal indicative of said supply current while said circuit is a second quiescent state, said analyzer further configured to indicate whether said circuit is defective based on said comparison.

20. The system of claim 19, wherein said analyzer is configured to calculate said threshold value based on the following equation:

$$I_{DDQ,max} = m(I_{DDQ,min}) + b,$$

where $I_{DDQ,max}$ is a value indicative of the approximate maximum measured supply current provided to said plurality of circuits while said circuits are in defect free states, where $I_{DDQ,min}$ is a value indicative of the approximate minimum measured supply current provided to said plurality of circuits while said circuits are in defect free states, and where m and b a constant values.

21. The system of claim 19 wherein m represents the slope of a line fitted to current signatures of said plurality of circuits.

* * * * *